(12) United States Patent
Haiberger et al.

(10) Patent No.: US 10,763,245 B2
(45) Date of Patent: Sep. 1, 2020

(54) OPTOELECTRONIC COMPONENT WITH A FIRST POTTING MATERIAL COVERING PARTS OF A FIRST OPTOELECTRONIC SEMICONDUCTOR CHIP AND A SECOND POTTING MATERIAL COVERING THE FIRST POTTING MATERIAL

(71) Applicant: OSRAM OLED GmbH, Regensburg (DE)

(72) Inventors: Luca Haiberger, Regensburg (DE); Matthias Sperl, Mintraching (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/719,810

(22) Filed: Sep. 29, 2017

(65) Prior Publication Data

US 2018/0102348 A1 Apr. 12, 2018

(30) Foreign Application Priority Data

Oct. 6, 2016 (DE) .................. 10 2016 119 002

(51) Int. Cl.
*H01L 25/075* (2006.01)
*H01L 23/31* (2006.01)
(Continued)

(52) U.S. Cl.
CPC ...... *H01L 25/0753* (2013.01); *H01L 23/3135* (2013.01); *H01L 24/73* (2013.01);
(Continued)

(58) Field of Classification Search
CPC .............. H01L 2924/181; H01L 33/60; H01L 25/0753; H01L 33/58; H01L 33/62;
(Continued)

(56) References Cited

U.S. PATENT DOCUMENTS

2002/0093026 A1* 7/2002 Huang .................... H01L 24/97
257/98
2004/0217364 A1* 11/2004 Tarsa .................. H01L 25/0753
257/89
(Continued)

FOREIGN PATENT DOCUMENTS

DE 10 2010 012 602 A1 9/2011
DE 10 2012 111 065 A1 5/2014
(Continued)

*Primary Examiner* — David Chen
(74) *Attorney, Agent, or Firm* — DLA Piper LLP (US)

(57) ABSTRACT

An optoelectronic component includes a carrier, wherein a first optoelectronic semiconductor chip and a second optoelectronic semiconductor chip are arranged above a top side of the carrier, the optoelectronic semiconductor chips each include a top side, an underside situated opposite the top side, and side faces extending between the top side and the underside, the undersides of the optoelectronic semiconductor chips face the top side of the carrier, a first potting material is arranged above the top side of the carrier, the first potting material covering parts of the side faces of the first optoelectronic semiconductor chip, and a second potting material is arranged above the top side of the carrier, and the second potting material covering the first potting material.

10 Claims, 6 Drawing Sheets

(51) Int. Cl.

| | |
|---|---|
| *H01L 33/58* | (2010.01) |
| *H01L 23/00* | (2006.01) |
| *H01L 33/54* | (2010.01) |
| *H01L 33/60* | (2010.01) |
| *H01L 33/62* | (2010.01) |
| *H01L 33/52* | (2010.01) |
| *H01L 33/30* | (2010.01) |

(52) U.S. Cl.
CPC .............. *H01L 33/54* (2013.01); *H01L 33/58* (2013.01); *H01L 33/60* (2013.01); *H01L 33/62* (2013.01); *H01L 24/48* (2013.01); *H01L 33/30* (2013.01); *H01L 33/52* (2013.01); *H01L 2224/32225* (2013.01); *H01L 2224/48091* (2013.01); *H01L 2224/48225* (2013.01); *H01L 2224/48227* (2013.01); *H01L 2224/73265* (2013.01); *H01L 2924/181* (2013.01); *H01L 2933/005* (2013.01); *H01L 2933/0058* (2013.01)

(58) Field of Classification Search
CPC ............. H01L 33/56; H01L 2224/8592; H01L 2933/005; H01L 33/54; H01L 2933/0058; H01L 33/502; H01L 2924/12041; F21Y 2115/10; F21V 23/006
USPC ............... 257/89, 98, 99, E33.058, E33.072; 438/22, 28, 29, 106
See application file for complete search history.

(56) References Cited

U.S. PATENT DOCUMENTS

| | | | |
|---|---|---|---|
| 2008/0231181 A1* | 9/2008 | Pang ..................... | H01L 33/505 313/512 |
| 2011/0121335 A1* | 5/2011 | Takakusaki ............. | H01L 33/60 257/98 |
| 2011/0309755 A1* | 12/2011 | Wirth ..................... | H05B 45/20 315/151 |
| 2013/0105837 A1* | 5/2013 | West ....................... | H01L 33/60 257/98 |
| 2014/0131748 A1* | 5/2014 | Song ................... | H01L 25/0753 257/89 |
| 2016/0293811 A1* | 10/2016 | Hussell ............... | H01L 25/0753 |
| 2017/0040301 A1* | 2/2017 | Yamamoto .......... | H01L 25/0753 |
| 2018/0166612 A1* | 6/2018 | Jin .......................... | H01L 33/50 |

FOREIGN PATENT DOCUMENTS

| | | | |
|---|---|---|---|
| DE | 10 2015 112 042 A1 | 1/2017 | |
| EP | 2 811 517 A1 | 12/2014 | |
| WO | WO-2013056009 A1 * | 4/2013 | ............ H05B 33/02 |
| WO | 2016/161161 A1 | 10/2016 | |

* cited by examiner

OPTOELECTRONIC COMPONENT WITH A FIRST POTTING MATERIAL COVERING PARTS OF A FIRST OPTOELECTRONIC SEMICONDUCTOR CHIP AND A SECOND POTTING MATERIAL COVERING THE FIRST POTTING MATERIAL

TECHNICAL FIELD

This disclosure relates to an optoelectronic component and to a method of producing an optoelectronic component.

BACKGROUND

Optoelectronic components comprising a plurality of optoelectronic semiconductor chips are known. By way of example, optoelectronic components in which light-emitting diode chips respectively emitting in the red, blue and green spectral ranges are arranged jointly on a circuit board are known. Such optoelectronic components may, for example, produce video walls.

SUMMARY

We provide an optoelectronic component including a carrier, wherein a first optoelectronic semiconductor chip and a second optoelectronic semiconductor chip are arranged above a top side of the carrier, the optoelectronic semiconductor chips each include a top side, an underside situated opposite the top side, and side faces extending between the top side and the underside, the undersides of the optoelectronic semiconductor chips face the top side of the carrier, a first potting material is arranged above the top side of the carrier, the first potting material covering parts of the side faces of the first optoelectronic semiconductor chip, and a second potting material is arranged above the top side of the carrier, and the second potting material covering the first potting material.

We also provide a method of producing an optoelectronic component including providing a carrier including a top side; arranging a first optoelectronic semiconductor chip and a second optoelectronic semiconductor chip above a top side of the carrier, wherein the optoelectronic semiconductor chips each include a top side, an underside situated opposite the top side and side faces extending between the top side and the underside, and the undersides of the optoelectronic semiconductor chips face the top side of the carrier; arranging a first potting material above the top side of the carrier, wherein parts of the side faces of the first optoelectronic semiconductor chip are covered; and arranging a second potting material above the top side of the carrier, wherein the first potting material is covered.

LIST OF REFERENCE SIGNS

Figure 1:
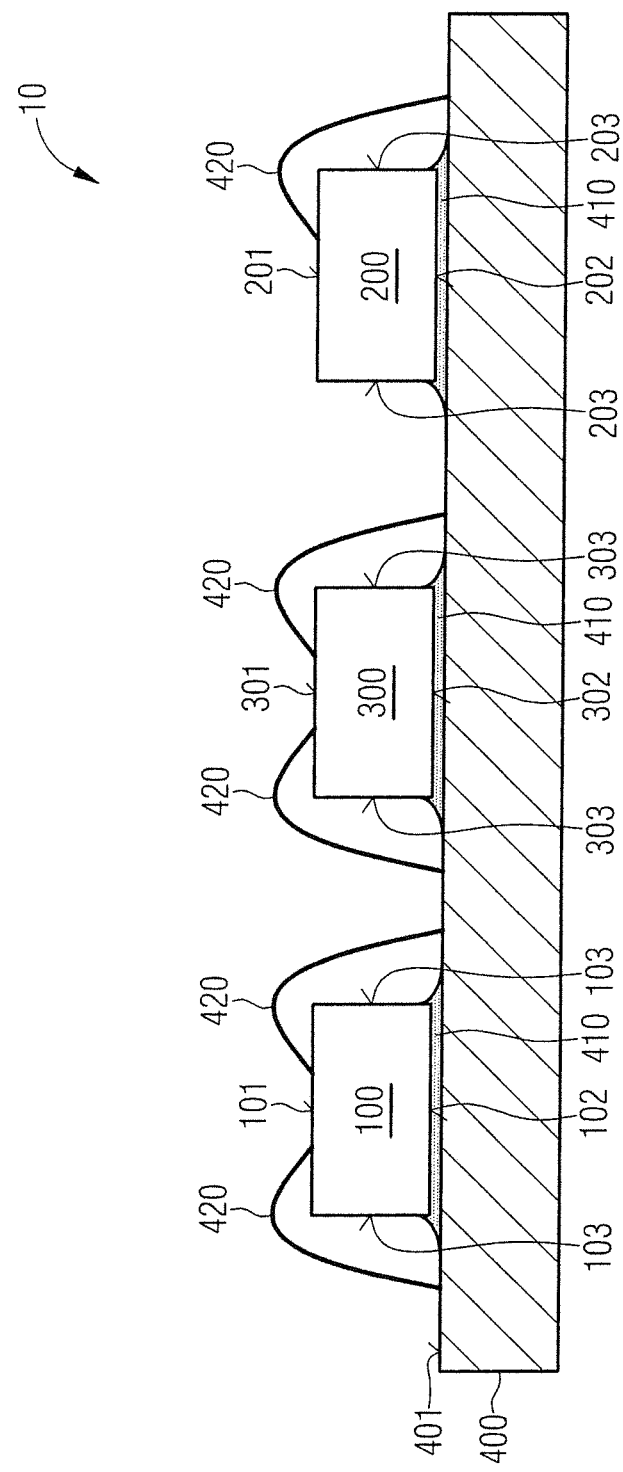
FIG. 1 schematically shows a sectional side view of a carrier including optoelectronic semiconductor chips arranged at a top side.

10 Optoelectronic component
20 Optoelectronic component
100 First optoelectronic semiconductor chip
101 Top side
102 Underside
103 Side face
200 Second optoelectronic semiconductor chip
201 Top side
202 Underside
203 Side face
300 Third optoelectronic semiconductor chip
301 Top side
302 Underside
303 Side face
400 Carrier
401 Top side
410 Adhesive
420 Bond wire
500 First potting material
510 Covering height
600 Second potting material

DETAILED DESCRIPTION

Our optoelectronic component comprises a carrier. A first optoelectronic semiconductor chip and a second optoelectronic semiconductor chip are arranged above a top side of the carrier. The optoelectronic semiconductor chips each comprise a top side, an underside situated opposite the top side, and side faces extending between the top side and the underside. In this case, the undersides of the optoelectronic semiconductor chips face the top side of the carrier. A first potting material is arranged above the top side of the carrier, the first potting material covering parts of the side faces of the first optoelectronic semiconductor chip. Moreover, a second potting material is arranged above the top side of the carrier, the second potting material covering the first potting material.

The first potting material and the second potting material may each fulfil dedicated tasks in this optoelectronic component. By way of example, the first potting material may at least partly reflect light emitted by the first optoelectronic semiconductor chip to reduce absorption losses. In this optoelectronic component, the second potting material may absorb light impinging on the optoelectronic component from outside to ensure a high contrast with respect to light emitted by the optoelectronic component. The fact that the second potting material covers the first potting material advantageously ensures that light impinging on the optoelectronic component from outside is not reflected at the first potting material.

The second potting material may cover at least parts of the side faces of the second optoelectronic semiconductor chip. This advantageously ensures that the vicinity of the second optoelectronic semiconductor chip is covered by the second potting material and, consequently, no optical reflection may take place at reflective surfaces in the vicinity of the second optoelectronic semiconductor chip.

The second potting material may terminate flush with the top sides of the first optoelectronic semiconductor chip and the second optoelectronic semiconductor chip. Advantageously, a homogeneous and planar top side of the optoelectronic component is formed as a result, the top side ensuring a strong optical contrast.

The first optoelectronic semiconductor chip may be configured as a volume emitting light-emitting diode chip, in particular as a volume emitting sapphire light-emitting diode chip. Advantageously, in this optoelectronic component, light emitted by the first optoelectronic semiconductor chip at the side faces thereof in a lateral direction is at least partly reflected at the first potting material at least partly covering the side faces of the first optoelectronic semiconductor chip and is thereby made usable. As a result, the optoelectronic component advantageously comprises only low absorption losses.

The second optoelectronic semiconductor chip may be configured as a surface emitting light-emitting diode chip, in particular as an InGaAlP light-emitting diode chip. In this case, the top side of the second optoelectronic semiconductor chip is a radiation emission side. Advantageously, in this optoelectronic component, there is a strong contrast between the radiation-emitting top side of the second optoelectronic semiconductor chip and the vicinity (formed by the second potting material) of the top side of the second optoelectronic semiconductor chip.

The first potting material may be light-reflecting. Advantageously, light emitted by the first optoelectronic semiconductor chip in a direction not corresponding to the emission direction of the optoelectronic component is thereby at least partly reflected at the first potting material and made usable as a result. In this optoelectronic component, absorption losses are advantageously reduced as a result.

The second potting material may be light-absorbing. Advantageously, in this optoelectronic component, a strong optical contrast between the light-emitting top sides of the optoelectronic semiconductor chips and the surrounding regions formed by the second potting material is achieved as a result.

The carrier may be configured as a circuit board. In this case, metallization surfaces that electrically contact the optoelectronic semiconductor chips of the optoelectronic component may advantageously be arranged at the top side of the carrier configured as a circuit board.

The first optoelectronic semiconductor chip and the second optoelectronic semiconductor chip may be attached to the top side of the carrier by an adhesive, in particular by a silver conductive adhesive or a white adhesive. This advantageously enables simple and cost-effective securing of the optoelectronic semiconductor chips at the top side of the carrier. In this case, possible light-reflecting properties of the adhesive advantageously do not lead to an impairment of the black impression and contrast achievable in the optoelectronic component since the adhesive is advantageously covered by the second potting material.

The side faces of the second optoelectronic semiconductor chip may not be covered by the first potting material. As a result a particularly good black impression and as a result a high optical contrast in the vicinity of the second optoelectronic semiconductor chip of the optoelectronic component are advantageously achieved.

Parts of the side faces of the second optoelectronic semiconductor chip may be covered by the first potting material. Advantageously, this example of the optoelectronic component is producible particularly simply and cost-effectively.

The first potting material may cover between ⅔ and ⅘ of the side faces of the first optoelectronic semiconductor chip and of the second optoelectronic semiconductor chip. Advantageously, such a covering of the side faces of the first optoelectronic semiconductor chip and the second optoelectronic semiconductor chip on the one hand ensures that a large portion of light emitted by the optoelectronic semiconductor chips in a direction not corresponding to the emission direction of the optoelectronic component is reflected at the first potting material and thereby potentially used, but on the other hand the first potting material is covered by a layer of the second potting material thick enough to ensure a high contrast to the optoelectronic component.

A third optoelectronic semiconductor chip may comprise a top side, an underside situated opposite the top side, and side faces extending between the top side and the underside is arranged above the top side of the carrier. In this case, the underside of the third optoelectronic semiconductor chip faces the top side of the carrier. In this case, the first potting material covers parts of the side faces of the third optoelectronic semiconductor chip. Advantageously, the first optoelectronic semiconductor chip, the second optoelectronic semiconductor chip and the third optoelectronic semiconductor chip in this optoelectronic component may be configured to emit light of the different wavelengths, for example, red, green and blue light. As a result, the optoelectronic component may make it possible to emit mixed light comprising an adjustable color.

The third optoelectronic semiconductor chip may be configured as a volume emitting light-emitting diode chip, in particular as a volume emitting sapphire light-emitting diode chip. Advantageously, light emitted by the third optoelectronic semiconductor chip at the side faces thereof is at least partly reflected by the first potting material covering the side faces of the third optoelectronic semiconductor chip, which prevents an absorption and hence a loss of the light. As a result, the optoelectronic component may advantageously comprise a high achievable luminous intensity and a high efficiency.

A method of producing an optoelectronic component comprises steps of providing a carrier comprising a top side, arranging a first optoelectronic semiconductor chip and a second optoelectronic semiconductor chip above a top side of the carrier, wherein the optoelectronic semiconductor chips each comprise a top side, an underside situated opposite the top side and side faces extending between the top side and the underside, wherein the undersides of the optoelectronic semiconductor chips face the top side of the carrier, arranging a first potting material above the top side of the carrier, wherein parts of the side faces of the first optoelectronic semiconductor chip are covered, and arranging a second potting material above the top side of the carrier, wherein the first potting material is covered.

Advantageously, this method enables production of an optoelectronic component in which the first potting material at least partly reflects light emitted by the first optoelectronic semiconductor chip in a direction not corresponding to the emission direction of the optoelectronic component and thereby makes the light accessible for use, and the second potting material absorbs light impinging on the optoelectronic component from outside to ensure a strong black impression and hence a high optical contrast between the radiation emission faces of the optoelectronic semiconductor chips and the vicinities of the radiation emission faces.

Arranging the first potting material may be carried out by needle dosing (dispensing) or jetting. Advantageously, the method thereby enables a precise arrangement of the first potting material.

Arranging the second potting material may be carried out by needle dosing (dispensing), jetting or spraying (spray coating). Advantageously, this enables a precise arrangement of the second potting material.

The above-described properties, features and advantages and also the way in which they are achieved will become clearer and more clearly understood in association with the following description of examples explained in greater detail in association with the drawings.

FIG. 1 shows a schematic sectional side view of an optoelectronic component 10 in an as yet unfinished processing state during production of the optoelectronic component 10. The optoelectronic component 10 emits light, for example, visible light. The optoelectronic component 10 may, for example, generate visible light comprising an adjustable color. The optoelectronic component 10 may be provided, for example, as a module to produce a video wall. In this case, the optoelectronic component 10 may form a pixel of the video wall.

The optoelectronic component 10 comprises a carrier 400. The carrier 400 may be configured, for example, as a circuit board, for example, as a printed circuit board (PCB).

Metallizations are arranged at a top side 401 of the carrier 400, the metallizations forming electrical contact pads. The metallizations may comprise gold, for example. In addition, electrical conductor tracks may be provided at the top side 401 of the carrier 400. The carrier 400 may also comprise electrical through contacts extending through the carrier 400 from the top side 401 of the carrier 400 to an underside of the carrier 400. Electrical contact pads and/or electrical conductor tracks may also be provided at the underside of the carrier 400. The carrier 400 may also comprise further contacts, for example, contacts that electrically contact the optoelectronic component 10 from outside.

A first optoelectronic semiconductor chip 100, a second optoelectronic semiconductor chip 200 and a third optoelectronic semiconductor chip 300 are arranged at the top side 401 of the carrier 400.

The first optoelectronic semiconductor chip 100 comprises a top side 101 and an underside 102 situated opposite the top side 101. Moreover, the first optoelectronic semiconductor chip 100 comprises side faces 103 extending between the top side 101 and the underside 102.

The first optoelectronic semiconductor chip 100 is configured as a volume emitting light-emitting diode chip. During operation of the first optoelectronic semiconductor chip 100, the latter emits light both at its top side 101 and at its side faces 103. The first optoelectronic semiconductor chip 100 may be configured, for example, as a volume emitting sapphire light-emitting diode chip. The first optoelectronic semiconductor chip 100 may be configured, for example, to emit light comprising a wavelength from the blue spectral range.

The first optoelectronic semiconductor chip 100 is arranged at the top side 401 of the carrier 400 such that the underside 102 of the first optoelectronic semiconductor chip 100 faces the top side 401 of the carrier 400. In this case, the first optoelectronic semiconductor chip 100 may be attached to the top side 401 of the carrier 400, for example, by an adhesive 410. The adhesive 410 may be, for example, a silver conductive adhesive or a white adhesive, that is to say an adhesive that comprises a silicone and a filling material comprising white reflecting particles, for example, particles comprising $TiO_2$.

At its top side 101, the first optoelectronic semiconductor chip 100 comprises two electrical contact regions, which, by two bond wires 420, are electrically conductively connected to electrical contact pads arranged at the top side 401 of the carrier 400.

The second optoelectronic semiconductor chip 200 comprises a top side 201, an underside 202 situated opposite the top side 201, and side faces 203 extending between the top 201 and the underside 202.

The second optoelectronic semiconductor chip 200 is configured as a surface emitting light-emitting diode chip. During operation of the second optoelectronic semiconductor chip 200, the latter emits electromagnetic radiation, for example, visible light at its top side 201, which thus forms a radiation emission side of the second optoelectronic semiconductor chip 200. The second optoelectronic semiconductor chip 200 may be configured, for example, as an InGaAlP light-emitting diode chip. The second optoelectronic semiconductor chip 200 may, for example, emit light comprising a wavelength from the red spectral range.

The second optoelectronic semiconductor chip 200 is arranged at the top side 401 of the carrier 400 such that the underside 202 of the second optoelectronic semiconductor chip 200 faces the top side 401 of the carrier 400. The second optoelectronic semiconductor chip 200 is attached to the top side 401 of the carrier 400 by an electrically conductive connection means, for example, by an electrically conductive adhesive 410. The electrically conductive adhesive 410 may be a silver conductive adhesive, for example.

The second optoelectronic semiconductor chip 200 comprises an electrical contact region each at its top side 201 and at its underside 202. The electrical contact region of the second optoelectronic semiconductor chip 200 arranged at the top side 201 electrically conductively connects to an electrical contact pad at the top side 401 of the carrier 400 by a bond wire 420. The electrical contact region of the second optoelectronic semiconductor chip 200 arranged at the underside 202 of the second optoelectronic semiconductor chip 200 electrically conductively connects to a contact pad formed at the top side 401 of the carrier 400 via the electrically conductive connection means, that is to say, for example, the electrically conductive adhesive 410.

The third optoelectronic semiconductor chip 300 comprises a top side 301, an underside 302 situated opposite the top side 301, and side faces 303 extending between the top side 301 and the underside 302.

The third optoelectronic semiconductor chip 300 is configured as a volume emitting light-emitting diode chip, for example, as a volume emitting sapphire light-emitting diode chip. The third optoelectronic semiconductor chip 300 may be configured, for example, to emit light comprising a wavelength from the green spectral range. The radiation emitted by the third optoelectronic semiconductor chip 300 is emitted at the top side 301 and at the side faces 303 of the third optoelectronic semiconductor chip 300.

The third optoelectronic semiconductor chip 300 is arranged at the top side 401 of the carrier 400 such that the underside 302 of the third optoelectronic semiconductor chip 300 faces the top side 401 of the carrier 400. The third optoelectronic semiconductor chip 300 may be attached to the top side 401 of the carrier 400, for example, by an adhesive 410, for example, by a silver conductive adhesive or a white adhesive.

The third optoelectronic semiconductor chip 300 comprises two electrical contact regions at its top side 301, the electrical contact regions connected to two electrical contact pads at the top side 401 of the carrier 400 by two bond wires 420.

In a simplified example of the optoelectronic component 10, either the first optoelectronic semiconductor chip 100 or the third optoelectronic semiconductor chip 300 may be omitted. It is also possible for the optoelectronic component 10 to comprise further optoelectronic semiconductor chips arranged at the top side 401 of the carrier 400, for example, further volume emitting light-emitting diode chips or further surface emitting light-emitting diode chips.

Figure 2:
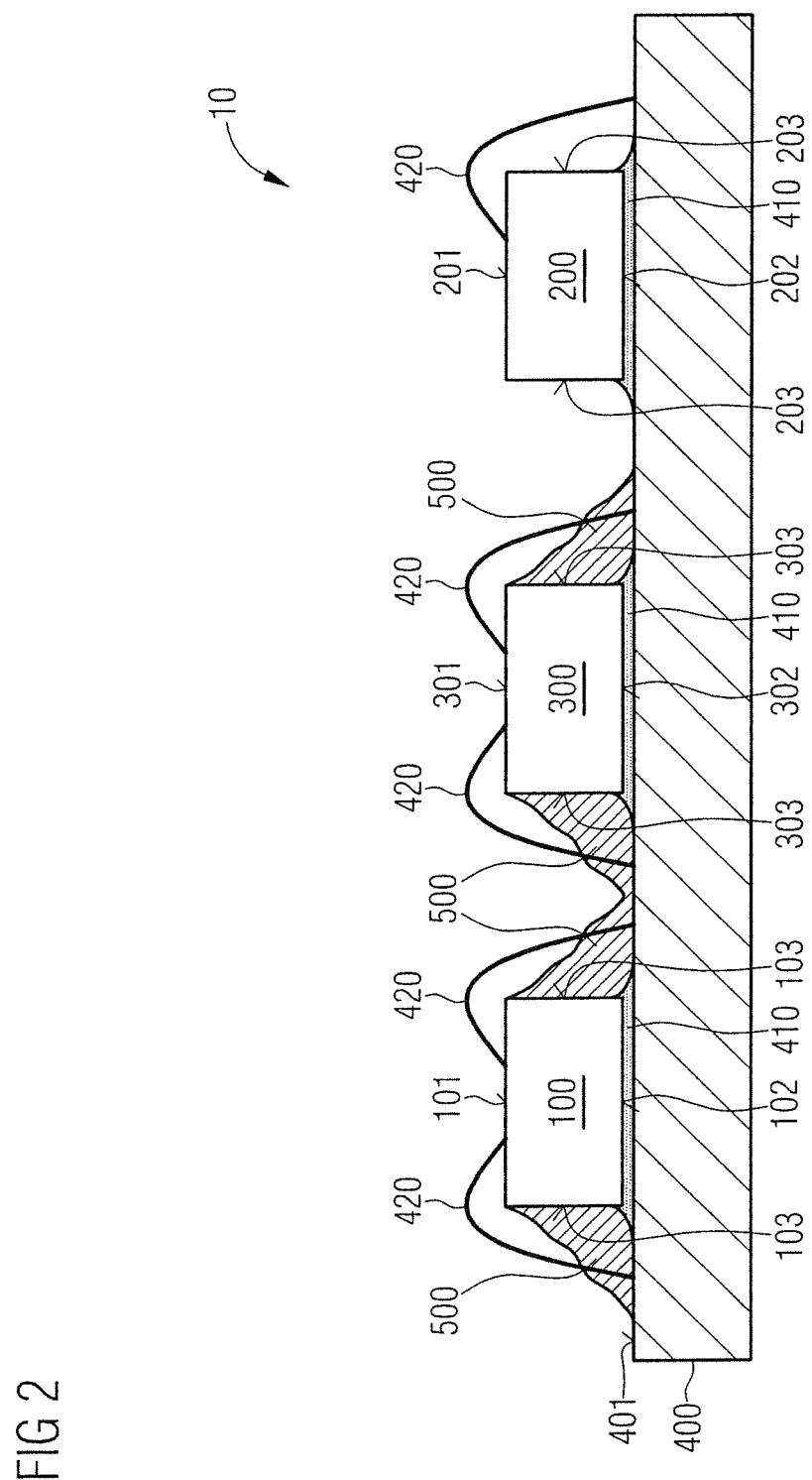
FIG. 2 schematically shows a sectional side view of the carrier and the optoelectronic semiconductor chips after a process of arranging a first potting material.

FIG. 2 shows a schematic sectional side view of the optoelectronic component 10 in a processing state temporally succeeding the illustration in FIG. 1.

A first potting material 500 has been arranged above the top side 401 of the carrier 400. The first potting material 500 has been arranged such that at least parts of the side faces 103 of the first optoelectronic semiconductor chip 100 and parts of the side faces 303 of the third optoelectronic semiconductor chip 300 have been wetted by the first potting material 500 and are now covered by the first potting material 500. It is expedient if the side faces 103 of the first optoelectronic semiconductor chip 100 and the side faces 303 of the third optoelectronic semiconductor chip 300 are wetted as completely as possible by the first potting material 500. The portions of the first potting material 500 which wet the side faces 103 of the first optoelectronic semiconductor chip 100 and the side faces 303 of the third optoelectronic semiconductor chip 300 form menisci bearing against the side faces 103, 303.

In the example shown in FIG. 2, the side faces 203 of the second optoelectronic semiconductor chip 200, by contrast, have not been wetted by the first potting material 500 and are not covered by the first potting material 500. Moreover the sections of the top side 401 of the carrier 400 arranged between the optoelectronic semiconductor chips 100, 200, 300 are at least not completely covered by the first potting material 500.

However, it would also be possible to arrange the first potting material 500 such that the side faces 203 of the second optoelectronic semiconductor chip 200 are at least partly covered by the first potting material 500 and/or the sections of the top side 401 of the carrier 400 arranged between the optoelectronic semiconductor chips 100, 200, 300 are partly or completely covered by the first potting material 500.

In any case, the interspaces between the optoelectronic semiconductor chips 100, 200, 300 are not completely filled with the first potting material 500 up to the top sides 101, 201, 301 of the optoelectronic semiconductor chips 100, 200, 300. In any case the top sides 101, 201, 301 of the optoelectronic semiconductor chips 100, 200, 300 also remain in a state not covered by the first potting material 500.

The first potting material 500 is configured such that it is light-reflecting, which means that the first potting material 500 reflects light emitted by the first optoelectronic semiconductor chip 100 and by the third optoelectronic semiconductor chip 300 with a high reflectance. The first potting material 500 may comprise a white color. The first potting material 500 may comprise, for example, a silicone or an epoxy and reflective particles embedded into the silicone or the epoxy, for example, particles comprising $TiO_2$.

A thixotropic index of the first potting material 500 may be adapted such that the first potting material 500 achieves good wetting of the side faces 103 of the first optoelectronic semiconductor chip 100 and the side faces 303 of the third optoelectronic semiconductor chip 300.

Arranging the first potting material 500 may have been carried out, for example, by needle dosing (dispensing) or by jetting. To support wetting of the side faces 103 of the first optoelectronic semiconductor chip 100 and the side faces 303 of the third optoelectronic semiconductor chip 300, the side faces 103 of the first optoelectronic semiconductor chip 100 and the side faces 303 of the third optoelectronic semiconductor chip 300 may have been subjected to a plasma process before the process of arranging the first potting material 500. It is likewise possible to provide at the top side 401 of the carrier 400 stop regions, for example, dams by which the first potting material 500 arranged above the top side 401 of the carrier 400 is delimited to the regions in the vicinity of the side faces 103, 303 of the first optoelectronic semiconductor chip 100 and of the third optoelectronic semiconductor chip 300.

Figure 3:
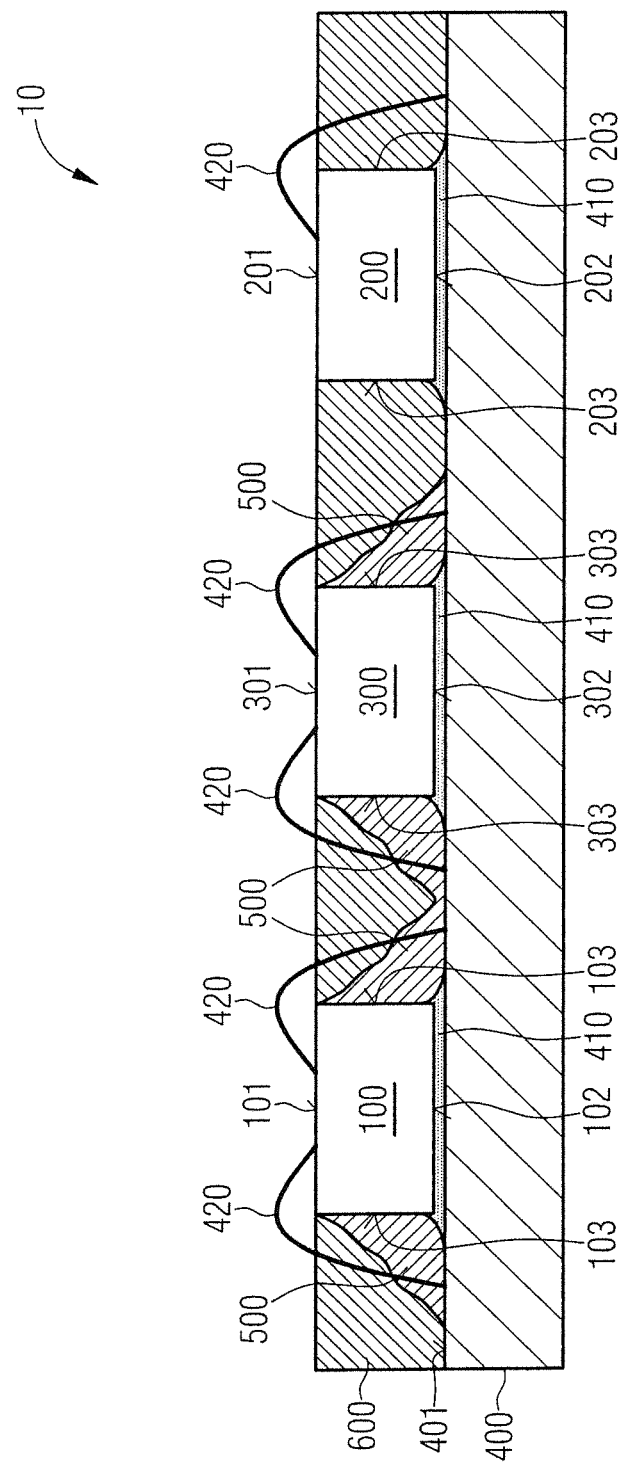
FIG. 3 schematically shows a sectional side view of the carrier, the optoelectronic semiconductor chips and the first potting material after a process of arranging a second potting material.

FIG. 3 shows a schematic sectional side view of the optoelectronic component 10 in a processing state temporally succeeding the illustration in FIG. 2.

A second potting material 600 has been arranged above the top side 401 of the carrier 400. The second potting material 600 covers the first potting material 500 previously arranged above the top side 401 of the carrier 400. Moreover, the second potting material 600 covers at least parts of the side faces 203 of the second optoelectronic semiconductor chip 200.

In the example illustrated, the second potting material 600 terminates flush with the top sides 101, 201, 301 of the optoelectronic semiconductor chips 100, 200, 300, which is expedient but not absolutely necessary. As a result, the side faces 203 of the second optoelectronic semiconductor chip 200 in the example illustrated are completely covered by the second potting material 600. If the side faces 103, 303 of the first optoelectronic semiconductor chip 100 and the third optoelectronic semiconductor chip 300 had not already been completely covered by the first potting material 500, those parts of the side faces 103, 303 of the first optoelectronic semiconductor chip 100 and the third optoelectronic semiconductor chip 300 which had previously been left uncovered may now have been covered by the second potting material 600.

The second potting material 600 also fills the interspaces between the optoelectronic semiconductor chips 100, 200, 300 such that the top side 401 of the carrier 400 is completely covered in the regions surrounding the optoelectronic semiconductor chips 100, 200, 300. The top sides 101, 201, 301 of the optoelectronic semiconductor chips 100, 200, 300 have remained in a state not covered by the second potting material 600.

The second potting material 600 is light-absorbing. This means that the second potting material 600 reflects visible light only with a low reflectance. The second potting material 600 may comprise a black color. The second potting material 600 may comprise, for example, a silicone or an epoxy and a black filler embedded into the silicone or the epoxy, for example, carbon embedded into the silicone or the epoxy.

Arranging the second potting material 600 may be carried out, for example, by needle dosing (dispensing) or jetting. It is expedient for the process of arranging the second potting material 600 to have been carried out only after complete curing of the first potting material 500.

Production of the optoelectronic component 10 may be concluded in the processing state shown in FIG. 3. However, even further processing steps may also follow the processing state shown in FIG. 3.

In the optoelectronic component 10, light emitted by the first optoelectronic semiconductor chip 100 and the third optoelectronic semiconductor chip 300 at the side faces 103, 303 in a lateral direction is at least partly reflected at the first potting material 500 covering the side faces 103, 303. As a result, the reflected light passes back into the optoelectronic semiconductor chips 100, 300 and is subsequently emitted at least partly at the top sides 101, 301 of the optoelectronic semiconductor chips 100, 300. As a result, in the optoelectronic component 10, light emitted by the optoelectronic semiconductor chips 100, 300 at the side faces 103, 303 in a lateral direction is at least not completely lost by absorption, but rather is at least partly used.

A large portion of light impinging on the top side of the optoelectronic component 10 from outside is absorbed at the second potting material 600. As a result, during operation of the optoelectronic component 10, there is a high brightness contrast between the radiation-emitting top sides 101, 201, 301 of the optoelectronic semiconductor chips 100, 200, 300 of the optoelectronic component 10 and the regions of the optoelectronic component 10 surrounding the top sides 101, 201, 301 of the optoelectronic semiconductor chips 100, 200, 300. Moreover, when the optoelectronic semiconductor chips 100, 200, 300 of the optoelectronic component 10 emit no light, the top side of the optoelectronic component 10 appears very dark such that a strong brightness contrast with respect to further light-emitting components in the vicinity of the optoelectronic component 10 may be achieved.

Since, in the optoelectronic component 10, light emitted by the first optoelectronic semiconductor chip 100 and the third optoelectronic semiconductor chip 300 at the side faces 103, 303 in a lateral direction may not emerge from the optoelectronic component 10, the light emitted by the optoelectronic component 10 comprises a stable color-over-angle behavior.

Figure 4:
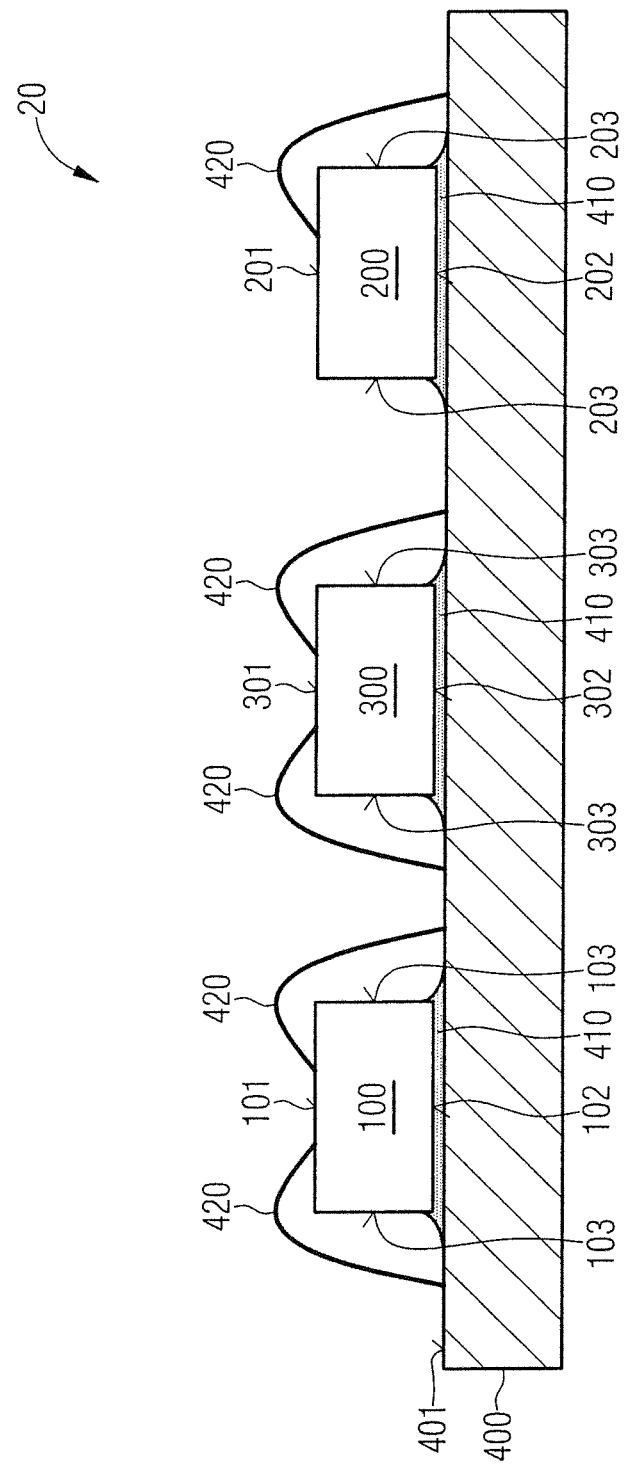
FIG. 4 schematically shows a further sectional side view of the carrier and of the optoelectronic semiconductor chips arranged at the top side thereof.

FIG. 4 shows a schematic sectional side view of an as yet unfinished optoelectronic component 20 in a processing state during production of the optoelectronic component 20.

The optoelectronic component 20 largely corresponds to the optoelectronic component 10 in FIGS. 1 to 3. Corresponding component parts are provided with the same reference signs in all the figures. The above description of the optoelectronic component 10 and the method of producing the optoelectronic component 10 is also applicable to the optoelectronic component 20 and the method serving of producing the optoelectronic component 20, unless deviations are described below.

The processing state of the optoelectronic component 20 as shown in FIG. 4 corresponds to the processing state of the optoelectronic component 10 as shown in FIG. 1.

Figure 5:
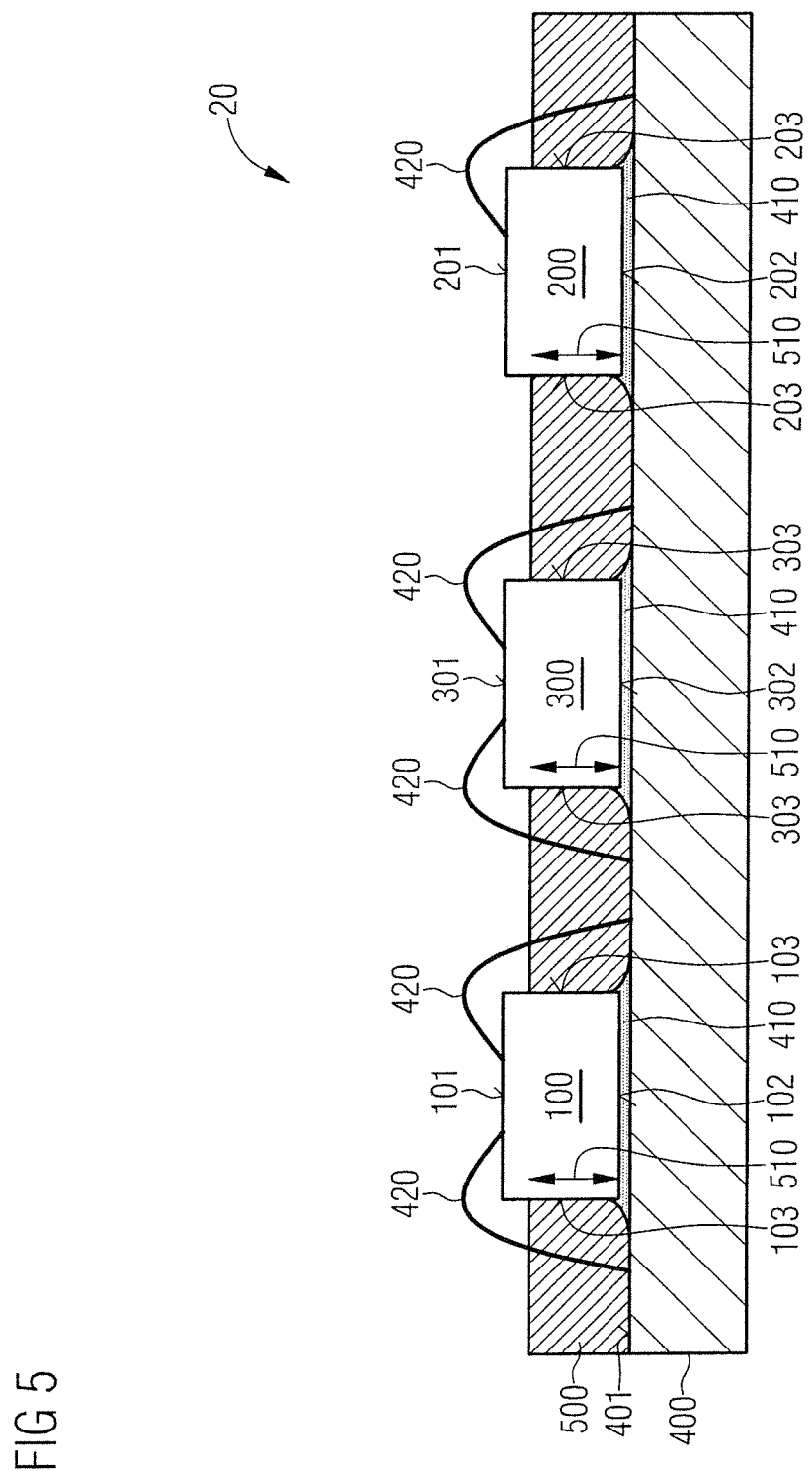
FIG. 5 schematically shows a sectional side view of the carrier and of the optoelectronic semiconductor chips after a process of arranging a first potting material.

FIG. 5 shows a schematic sectional side view of the optoelectronic component 20 in a processing state temporally succeeding the illustration in FIG. 4.

Once again, the first potting material 500 has been arranged above the top side 401 of the carrier 400. During production of the optoelectronic component 20, however, the first potting material 500 has been arranged above the top side 401 of the carrier 400 such that the side faces 103 of the first optoelectronic semiconductor chip 100 and the side faces 303 of the third optoelectronic semiconductor chip 300 and also the side faces 203 of the second optoelectronic semiconductor chip 200 have been partly wetted and covered by the first potting material 500. The top side 401 of the carrier 400 has also been covered by the first potting material 500 in the vicinity of the optoelectronic semiconductor chips 100, 200, 300 and the regions between the optoelectronic semiconductor chips 100, 200, 300.

The first potting material 500 forms a layer of uniform thickness covering the top side 401 of the carrier 400. In this case, however, the thickness of the layer of the first potting material 500 is smaller than the height of the optoelectronic semiconductor chips 100, 200, 300 such that the layer of the first potting material 500 does not terminate flush with the top sides 101, 201, 301 of the optoelectronic semiconductor chips 100, 200, 300. The top side of the layer of the first potting material 500 is lower than the top sides 101, 201, 301 of the optoelectronic semiconductor chips 100, 200, 300.

As a result, the side faces 103, 203, 303 are covered by the first potting material 500 only up to a covering height 510, which may be, for example, between ⅔ and ⅘ of the height of the optoelectronic semiconductor chips 100, 200, 300. As a result, moreover, only a corresponding proportion of the side faces 103, 203, 303 of the optoelectronic semiconductor chips 100, 200, 300 is covered by the first potting material 500, for example, a portion of the side faces 103, 203, 303 that is between ⅔ and ⅘.

In the optoelectronic component 20, the first potting material 500 may be configured as in the optoelectronic component 10. To produce the optoelectronic component 20, too, the first potting material 500 may be arranged above the top side 401 of the carrier 400, for example, by needle dosing or jetting.

Figure 6:
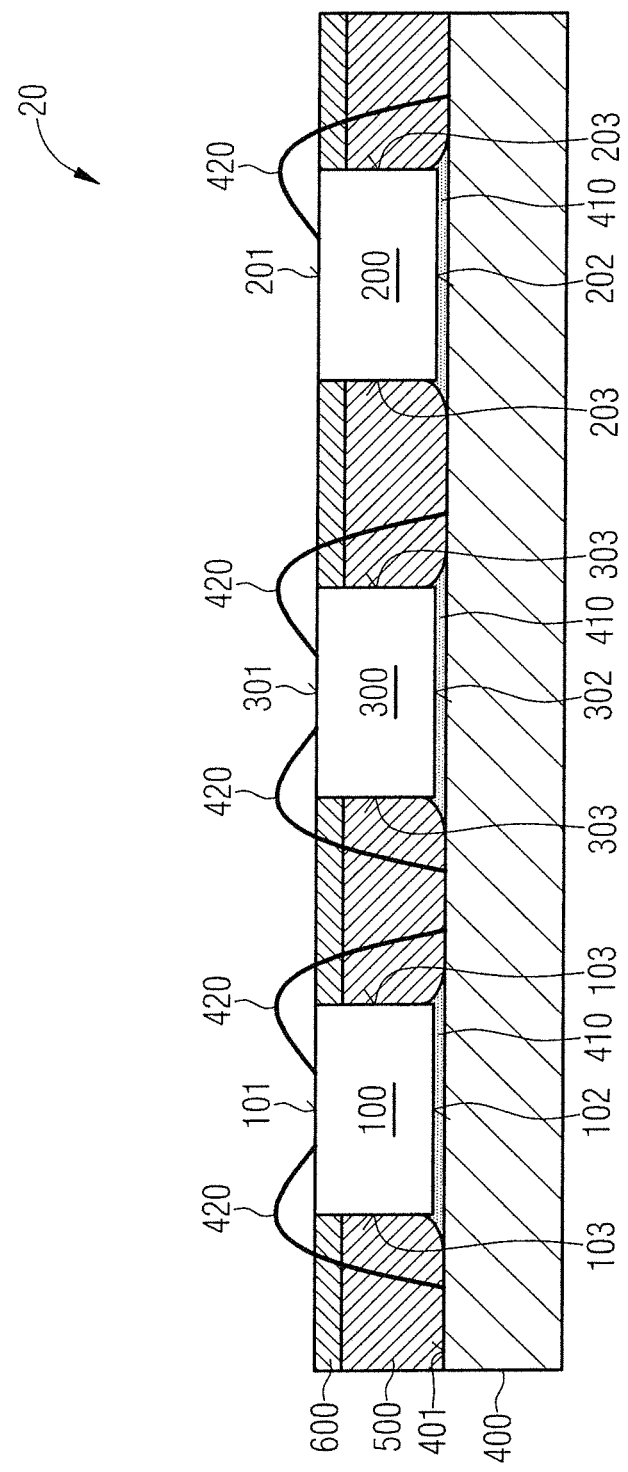
FIG. 6 schematically shows a sectional side view of the carrier, the optoelectronic semiconductor chips and the first potting material after a process of arranging a second potting material.

FIG. 6 shows a schematic sectional side view of the optoelectronic component 20 in a processing state temporally succeeding the illustration in FIG. 5. In the processing state shown in FIG. 6, the production of the optoelectronic component 20 may be concluded. However, even further processing steps may also follow the processing state shown in FIG. 6.

Once again, the second potting material 600 has been arranged above the top side 401 of the carrier 400 such that the first potting material 500 has been covered by the second potting material 600. The second potting material 600 fills the gaps that remained between the optoelectronic semiconductor chips 100, 200, 300 such that the second potting material 600 terminates flush with the top sides 101, 201, 301 of the optoelectronic semiconductor chips 100, 200, 300 and covers those parts of the side faces 103, 203, 303 of the optoelectronic semiconductor chips 100, 200, 300 that are not covered by the first potting material 500.

In the optoelectronic component 20, the second potting material 600 may be configured as in the optoelectronic component 10.

In the optoelectronic component 20, the process of arranging the second potting material 600 may have been carried out as in the case of the first potting material 500. If arranging the second potting material 600 has been carried out by needle dosing or jetting, then arranging the second potting material 600 may, however, already have been carried out before curing the first potting material 500 in a wet-in-wet process to increase adhesion between the first potting material 500 and the second potting material 600. Alternatively, arranging the second potting material 600 may also have been carried out by a spraying method (spray coating). In this case, the top sides 101, 201, 301 of the optoelectronic semiconductor chips 100, 200, 300 may have been covered by a mask during the process of arranging the second potting material 600 to prevent the top sides 101, 201, 301 from being covered by the second potting material 600.

In the optoelectronic component 20, too, light emitted by the first optoelectronic semiconductor chip 100 and the third optoelectronic semiconductor chip 300 at the side faces 103, 303 thereof in a lateral direction is at least partly reflected at the first potting material 500 as a result is at least partly emitted at the top sides 101, 301 of the first optoelectronic semiconductor chip 100 and the third optoelectronic semiconductor chip 300 and is thereby made at least partly usable. In the optoelectronic component 20, too, light impinging on the optoelectronic component 20 from outside is at least partly absorbed at the second potting material 600.

Our components and methods have been illustrated and described in greater detail on the basis of preferred examples. Nevertheless, this disclosure is not restricted to the examples disclosed. Rather, other variations may be derived therefrom by those skilled in the art, without departing from the scope of protection of the appended claims.

This application claims priority of DE 10 2016 119 002.0, the subject matter of which is incorporated herein by reference.

The invention claimed is:

1. An optoelectronic component comprising:
   a carrier;
   a first optoelectronic semiconductor chip that is a volume emitting light-emitting diode chip and has a top side, and a second optoelectronic semiconductor chip that is a surface emitting light-emitting diode chip and a top side of the second optoelectronic semiconductor chip is a radiation emission side arranged above a top side of the carrier, wherein the optoelectronic semiconductor chips each comprise an underside situated opposite the top side and side faces extending between the top side and the underside, and the undersides of the optoelectronic semiconductor chips face the top side of the carrier;
   a first potting material arranged above the top side of the carrier, said first potting material covering parts of the side faces of the first optoelectronic semiconductor chip, wherein the side faces of the second optoelectronic semiconductor chip are not covered by the first potting material; and
   a second potting material arranged above the top side of the carrier, and said second potting material covering the first potting material, wherein the second potting material terminates flush with the top sides of the first optoelectronic semiconductor chip and the second optoelectronic semiconductor chip.

2. The optoelectronic component according to claim 1, wherein the second potting material covers at least parts of the side faces of the second optoelectronic semiconductor chip.

3. The optoelectronic component according to claim 1, wherein the first optoelectronic semiconductor chip is configured as a volume emitting sapphire light-emitting diode chip.

4. The optoelectronic component according to claim 1, wherein the second optoelectronic semiconductor chip is configured as an InGaAlP light-emitting diode chip.

5. The optoelectronic component according to claim 1, wherein the first potting material is light-reflecting.

6. The optoelectronic component according to claim 1, wherein the second potting material is light-absorbing.

7. The optoelectronic component according to claim 1, wherein the carrier is configured as a circuit board.

8. The optoelectronic component according to claim 1, wherein the first optoelectronic semiconductor chip and the second optoelectronic semiconductor chip are attached to the top side of the carrier by an adhesive, a silver conductive adhesive or a white adhesive.

9. The optoelectronic component according to claim 1,
   wherein a third optoelectronic semiconductor chip comprising a top side, an underside situated opposite the top side, and side faces extending between the top side and the underside, is arranged above the top side of the carrier,
   the underside of the third optoelectronic semiconductor chip faces the top side of the carrier, and
   the first potting material covers parts of the side faces of the third optoelectronic semiconductor chip.

10. The optoelectronic component according to claim 9, wherein the third optoelectronic semiconductor chip is configured as a volume emitting light-emitting diode chip, or a volume emitting sapphire light-emitting diode chip.

* * * * *